(12) United States Patent
Martinson et al.

(10) Patent No.: US 9,040,113 B2
(45) Date of Patent: May 26, 2015

(54) ATOMIC LAYER DEPOSITION OF METAL SULFIDE THIN FILMS USING NON-HALOGENATED PRECURSORS

(75) Inventors: Alex B. F. Martinson, Woodridge, IL (US); Jeffrey W. Elam, Elmhurst, IL (US); Michael J. Pellin, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 1031 days.

(21) Appl. No.: 12/780,664

(22) Filed: May 14, 2010

(65) Prior Publication Data

US 2010/0300524 A1  Dec. 2, 2010

Related U.S. Application Data

(60) Provisional application No. 61/181,181, filed on May 26, 2009.

(51) Int. Cl.
| | |
|---|---|
| *B05D 5/12* | (2006.01) |
| *H01L 21/02* | (2006.01) |
| *C23C 16/30* | (2006.01) |
| *C23C 16/455* | (2006.01) |
| *H01L 31/0224* | (2006.01) |
| *H01L 31/032* | (2006.01) |
| *H01L 31/0336* | (2006.01) |
| *H01L 31/0352* | (2006.01) |
| *H01L 31/072* | (2012.01) |

(52) U.S. Cl.
CPC .......... *H01L 21/0243* (2013.01); *C23C 16/305* (2013.01); *C23C 16/45553* (2013.01); *H01L 21/02557* (2013.01); *H01L 21/02568* (2013.01); *H01L 21/0262* (2013.01); *H01L 31/022425* (2013.01); *H01L 31/032* (2013.01); *H01L 31/0336* (2013.01); *H01L 31/03529* (2013.01); *H01L 31/072* (2013.01); *Y02E 10/50* (2013.01)

(58) Field of Classification Search
USPC ..................... 427/74, 255.7; 136/265; 438/85
See application file for complete search history.

(56) References Cited

U.S. PATENT DOCUMENTS

| | | | | |
|---|---|---|---|---|
| 4,948,623 | A * | 8/1990 | Beach et al. .................. | 427/586 |
| 7,041,596 | B1 * | 5/2006 | Dalton et al. ................. | 438/650 |

(Continued)

OTHER PUBLICATIONS

Martinson et al., "Atomic layer deposition of Cu2S for future application in photovoltaics", Applied Physics Letters 94, 123107 (2009).*

(Continued)

*Primary Examiner* — Austin Murata
(74) *Attorney, Agent, or Firm* — Foley & Lardner LLP

(57) ABSTRACT

A method for preparing a metal sulfide thin film using ALD and structures incorporating the metal sulfide thin film. The method includes providing an ALD reactor, a substrate, a first precursor comprising a metal and a second precursor comprising a sulfur compound. The first and the second precursors are reacted in the ALD precursor to form a metal sulfide thin film on the substrate. In a particular embodiment, the metal compound comprises Bis(N,N'-di-sec-butylacetamidinato)dicopper(I) and the sulfur compound comprises hydrogen sulfide ($H_2S$) to prepare a $Cu_2S$ film. The resulting metal sulfide thin film may be used in among other devices, photovoltaic devices, including interdigitated photovoltaic devices that may use relatively abundant materials for electrical energy production.

17 Claims, 5 Drawing Sheets

(56) References Cited

U.S. PATENT DOCUMENTS

| | | | |
|---|---|---|---|
| 7,148,144 B1* | 12/2006 | Avanzino | 438/687 |
| 2005/0098204 A1* | 5/2005 | Roscheisen et al. | 136/263 |
| 2005/0186342 A1* | 8/2005 | Sager et al. | 427/248.1 |
| 2008/0142972 A1* | 6/2008 | Redeker et al. | 257/751 |

OTHER PUBLICATIONS

Johansson et al., "Growth of Conductive Copper Sulfide Thin Films by Atomic Layer Deposition", *J. Mater. Chem.*, (2002), vol. 12, pp. 1022-1026.

Li et al., "Atomic Layer Deposition of Ultrathin Copper Metal Films from a Liquid Copper(I) Amidinate Precursor", *Journal of the Electrochemical Society*, (2006), vol. 153, No. 11, pp. C787-C794, The Electrochemical Society.

Meester et al., "Low Pressure Chemical Vapor Deposition of $Cu_xS$", *J. Phys, IV France*, (2001), pp. Pr3-239-Pr3-246, EDP Sciences, Les Ulis.

Nanu et al., "$CuInS_2$-$TiO_2$ Heterojunctions Solar Cells Obtained by Atomic Layer Deposition", *Thin Solid Films*, (2003), pp. 492-496, vol. 431-432, Elsevier, The Netherlands.

Reijnen et al., "Comparison of $Cu_xS$ Films Grown by Atomic Layer Deposition and Chemical Vapor Deposition", *Chem. Mater.*, (2005), pp. 2724-2728, American Chemical Society, USA.

Schneider et al., "Copper(I) *tert*-Butylthiolato Clusters as Single-Source Precursors for High-Quality Chalcocite Thin Films: Film Growth and Microstructure Control", *Chem. Mater.*, (2007), pp. 2780-2785, vol. 19, American Chemical Society, USA.

Zhengwen Li, et al., "Synthesis and Characterization of Copper(I) Amidinates as Precursors for Atomic Layer Deposition (ALD) of Copper Metal", *Inorganic Chemistry.*, vol. 44, No. 6, 2005 pp. 1728-1735, American Chemical Society, USA, Published on the Web Feb. 3, 2005.

\* cited by examiner

Figure 5A
Figure 5B
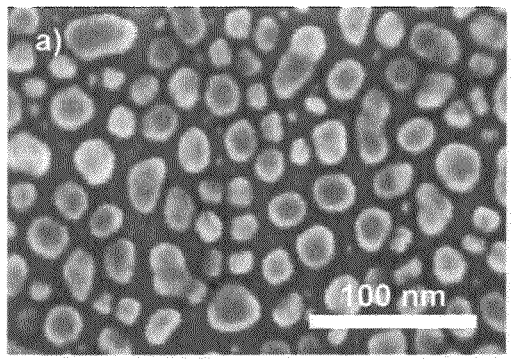
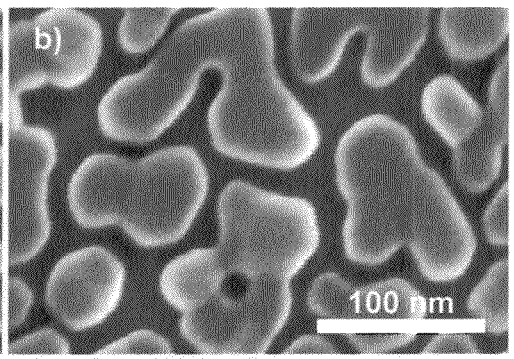
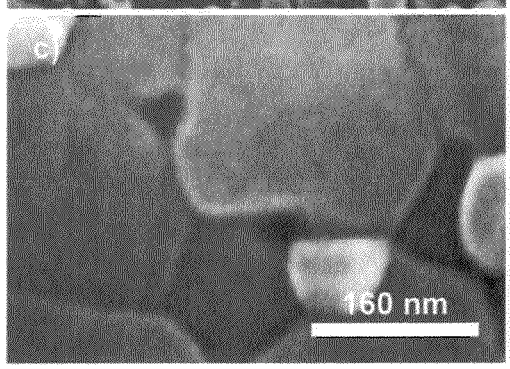
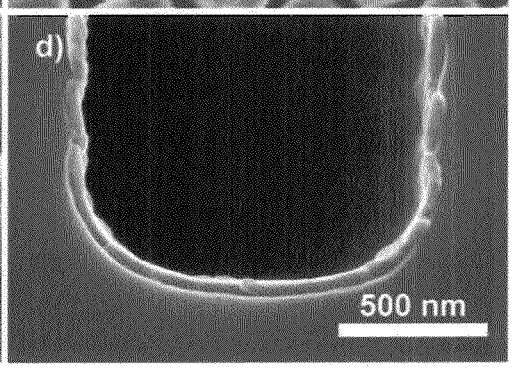
Figure 5C
Figure 5D
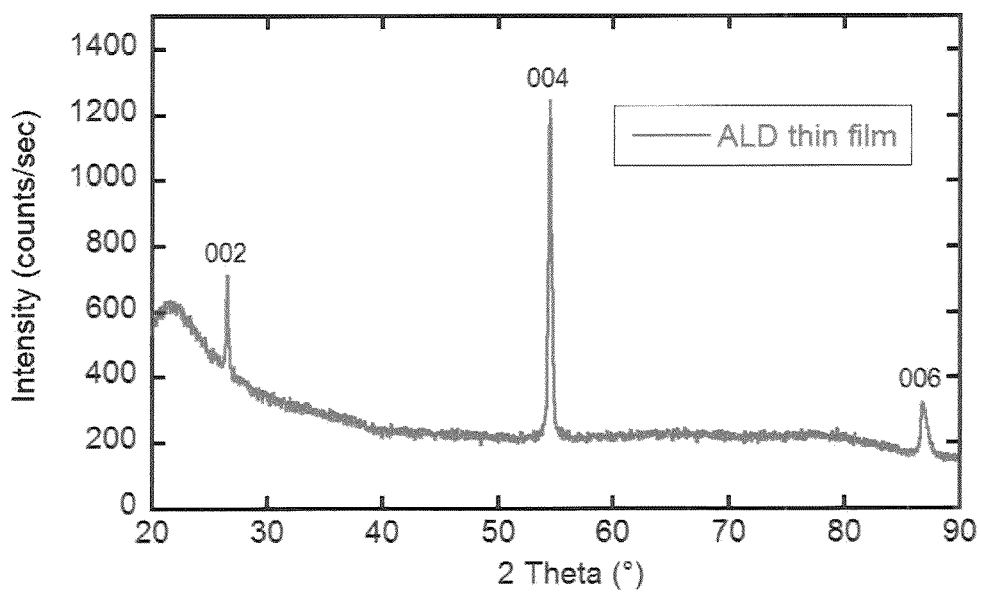
Figure 6

ATOMIC LAYER DEPOSITION OF METAL SULFIDE THIN FILMS USING NON-HALOGENATED PRECURSORS

CROSS REFERENCE TO RELATED APPLICATIONS

This application is related to and claims priority from U.S. Provisional Patent Application 61/181,181, filed May 26, 2009 and is hereby incorporated by reference in its entirety.

STATEMENT OF GOVERNMENT INTEREST

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

FIELD OF THE INVENTION

The present invention relates generally to the field of processes for making metal films and structures and articles of manufacture comprising such films. More particularly, the invention relates to methods for growing conformal metal sulfide films on nanostructures using atomic layer deposition and the resulting structures that may be used in various applications, including a photovoltaic device.

BACKGROUND OF THE INVENTION

This section is intended to provide a background or context to the invention that is, inter alia, recited in the claims. Unless otherwise indicated herein, what is described in this section is not prior art to the description and claims in this application and is not admitted to be prior art by inclusion in this section.

There is a need to provide clean, safe, and sustainable energy to supply the growing global demand for energy. In contrast to other renewable resources whose globally extractable power is each less than 5 TW, the solar constant upon the earth's surface (120,000 TW) will exceed worldwide energy demand into the foreseeable future. This abundant supply of sunlight and the environmental friendliness of solar energy make the efficient conversion of solar radiation into electricity a compelling economic and scientific goal.

Photovoltaic (PV) devices that covert solar energy to electricity have been in use for several decades. However, widespread adoption of PV devices has been somewhat limited by their expense and inefficiency relative to other sources of energy. Advances in structures and materials are important to achieving widespread adoption of effective PV devices. The most desirable materials for use in PV, applications are both inexpensive and abundant. In general, however, these materials have high impurity and defect concentrations, both of which limit the diffusion length of charge carriers which is a critical performance parameter of PV devices. The reduced length over which charges may be extracted ($L_{CE}$) effectively limits the useful thickness of the active layer, as thicker layers will not increase device efficiency. For example, the efficiency of silicon PV devices scale with semiconductor quality as the $L_{CE}$ approaches the active layer thickness required to collect 90% of incident photons ($L_{OD}$). Decoupling these two important parameters has recently been recognized in several PV fields, including polymer and Si p-n junctions. The initial experimental results in this direction are modest, owing to the complexity of fabricating such sophisticated geometries.

Structural improvements in PV devices has opened the door to the use of new, less expensive materials that often possess highly desirable characteristics. To this end, there has been interest in using certain transition metal compounds, including copper compounds, among others. For example, various attempts using $Cu_2S$ in PV devices have been made. The first thin film. PV devices comprised $CdS/Cu_2S$ heterojunctions formed through the topotaxial exchange of Cd atoms on a CdS surface for $Cu^+$ ions in solution. Interest in the technology waned in the late 1980s, however, in light of the instability of the heterojunction through which $Cu^+$ ions are prone to diffuse. In its place, the more costly ternary chalcogenide chalcopyrites ($CuMX_2$) [M=In, Ga; X=S, Se] have been developed, with power efficiencies now approaching 20%.

More recently, it has been shown that it is feasible to form stable p/n heterojuctions with $Cu_xS$ paired with an alternative n-type semiconductor, $TiO_2$. As cation exchange is not possible in these Cd-free PVs, alternative deposition methods for $Cu_xS$ are required. More specifically, chalcocite ($Cu_xS$, x~2) is favored for PV applications among a sizeable number of copper-poor polymorphs ($Cu_xS$, $2 \geq x \geq 1.75$) as it offers the largest spectral coverage and most appropriate conductivity. In addition to traditional topotaxial growth, previous routes to phase-pure chalcocite include single-source evaporation and reactive sputtering. Techniques using nanoparticle syntheses and aerosol assisted chemical vapor deposition (AACVD, a liquid precursor delivery technique akin to spray pyrolysis) have also been attempted.

Atomic layer deposition (ALD) is one technique for producing thin, conformal layers. The ALD of $Cu_2S$ has also been attempted by alternating exposure to $Cu(thd)_2$ (thd=thd-2,2,6,6-tetramethyl-3,5-heptanedione) and $H_2S$. However, existing methods for formation of $Cu_2S$ ALD are not adequate. For example, over the range of temperatures in which the deposition is self-limiting, the growth rate is slow, not exceeding 0.4 Å/cycle. Notably, only the less desirable CuS (covellite) and/or $Cu_{1.8}S$ (digenite) phases are obtained using this approach. Additionally, thermal decomposition of the $Cu(thd)_z$ precursor limits the ability to coat nanoporous supports desirable in advanced PV devices. $CuCl_2$ can also be used, but this requires excessively high temperatures, and the HCl byproduct can result in etching of the films and the deposition equipment. Thus, a substantially pure (and highly desirable) chalcocite phase has not been achieved with these precursors.

SUMMARY OF THE INVENTION

In a PV device, the reduced length over which charges may be extracted ($L_{CE}$) effectively limits the useful thickness of the active layer. The efficiency of PVs scale with semiconductor quality as the $L_{CE}$ approaches the active layer thickness required to collected 90% of incident photons ($L_{OD}$). Surmounting the incongruity between $L_{OD}$ and $L_{CE}$ in inexpensive materials may be accomplished by decoupling light absorption and carrier extraction into orthogonal spatial dimensions. For example, a PV device may be prepared where the planar junction is effectively folded to form a nanorod array. The interdigitation of not only the active layers, but also two transparent conducting oxide (TCO) electrodes allow for radial charge collection in the PV device. The result is a PV device where the total device thickness may be tuned for sufficient light absorption independent of the active layer thickness, which may be chosen to be equal to $L_{CE}$. Thus, the device allows for efficient charge collection throughout the optically dense PV device, independent of the diffusion length (i.e. quality) or absorptivity of the material employed.

This invention comprises improved methods for preparing thin films of metal sulfide materials and resulting structures and articles of manufacture. The invention may be particularly applicable for producing thin films of metal sulfides (e.g., copper sulfide, $Cu_2S$, $In_xS_y$) for use as the light absorbing layer in solar cells. The methods may also be used in forming mixed metal sulfides (e.g., $CuInS_y$). These methods provide techniques for producing various metal sulfides in the form of thin, conformal layers on nanoporous supports as applicable to preparing solar cells, including interdigitated PV devices.

With regard to $Cu_2S$, a true gas phase chemical vapor deposition route to high quality chalcocite films has been elusive. Importantly, a conformal (not line-of-sight) growth method compatible with nanoscale structuring is needed to diminish the discrepancy between the minority carrier diffusion length (20-240 nm) and the thickness necessary (>1 μm) for ample light harvesting in the near IR spectrum. Decoupling light absorption and carrier extraction into orthogonal spatial dimensions through use of high-aspect ratio architectures may diminish this incongruity. An ALD process may be used to prepare, for example, a copper sulfide ($Cu_2S$) film, on a high-aspect ratio substrate. Thus, through ALD and/or additional further processes a relatively efficient and low cost interdigitated PV device may be prepared.

Various ALD precursors may be used to prepare metal and mixed metal sulfide films on a substrate, including an interdigitated PV device. For example, a $Cu_2S$ film may be prepared by ALD using a non-halogenated precursor that is sufficiently reactive at lower temperatures. In one embodiment, Bis(N,N'-di-sec-butylacetamidinato)dicopper(I), (Cu $(DSB)_2$), along with hydrogen sulfide ($H_2S$) precursors may be used to prepare a $Cu_2S$ film by ALD. Additionally, a cyclopentadienyl indium (InCp) precursor and a $H_2S$ precursor may be used to prepare a film of $In_2S_3$ by ALD. InCp shares many of the same advantages as the $Cu(DSB)_2$, namely lower deposition temperatures and an absence of problems associated with halogenated byproducts. Multiple metal precursors may be used to form ALD mixed Metal sulfide films. For example, a copper indium sulfide ($CuInS_2$) film may be prepared by applying the $Cu_2S$ and the $In_2S_3$ ALD precursors. These improved methods for depositing metal sulfide layers on a substrate will facilitate the manufacturing of interdigitated photovoltaic devices. Additionally, capitalizing on these advances in ALD and PV technology, new avenues in selective contacts, tandem PV and devices capable of water splitting all will become feasible.

In one embodiment, a method for preparing a portion of an interdigitated photovoltaic device is provided. The method comprises providing an atomic layer deposition (ALD) reactor, a high-aspect ratio substrate, a first precursor and a second precursor. The first precursor comprises at least one metal and the second precursor comprises a sulfur compound. The method further comprises exposing the high-aspect ratio substrate to the first precursor for a first period and exposing the high-aspect ratio substrate to the second precursor for a second period. The cycle of exposing the substrate to the first and the second precursors is repeated for a number of cycles until a metal sulfide film of a desired thickness is formed on the high-aspect ratio substrate.

In another embodiment, a method for preparing a $Cu_2S$ film on a substrate is provided. The method comprises providing an ALD reactor, a substrate, a first precursor and a second precursor. The first precursor comprises copper and the second precursor comprises $H_2S$. The method further comprises heating the substrate to a reaction temperature, exposing the substrate to the first precursor for a first predetermined duration and exposing the substrate to the second precursor for a second predetermined duration. The exposure of the substrate to first precursor and the second precursor is repeated for a predetermined number of cycles to form a $Cu_2S$ film on the substrate.

In still another embodiment, an interdigitated photovoltaic structure is provided. The structure comprises at least one transparent oxide conductor (TCO) electrode and an interfacial active layer coupled to the at least one TCO electrode. The interfacial active layer includes a first film coupled to a second film. The first film comprises a metal sulfide film. The at least one TCO electrode and the interfacial active layer are arranged to comprise a three dimensional nano-scale structure configured for substantially radial charge collection in response to incident light.

These and other advantages and features of the invention, together with the organization and manner of operation thereof, will become apparent from the following detailed description when taken in conjunction with the accompanying drawings, wherein like elements have like numerals throughout the several drawings described below.

BRIEF DESCRIPTION OF THE DRAWINGS

FIG. 5A shows an SEM image of $H_2S$ deposited by ALD after 54 cycles; FIG. 5B is an SEM image of $H_2S$ deposited by ALD after 162 cycles; FIG. 5C is an SEM image of $H_2S$ deposited by ALD after 500 cycles; FIG. 5D is a cross-sectional view of a $H_2S$ conformal film resulting from 500 cycles on a Si trench wafer;

FIG. 6 shows an XRD pattern of 500 cycle chalcocite film on fused silica indexed to β-$Cu_2S$ (JCPDS 26-1116)

DETAILED DESCRIPTION OF THE PREFERRED EMBODIMENTS

The atomic layer deposition (ALD) process permits preparation of custom films with desired characteristics with nanoscale precision. Various interdigitated structures may be formed to optimize solar collection and charge production.

Figure 1A:
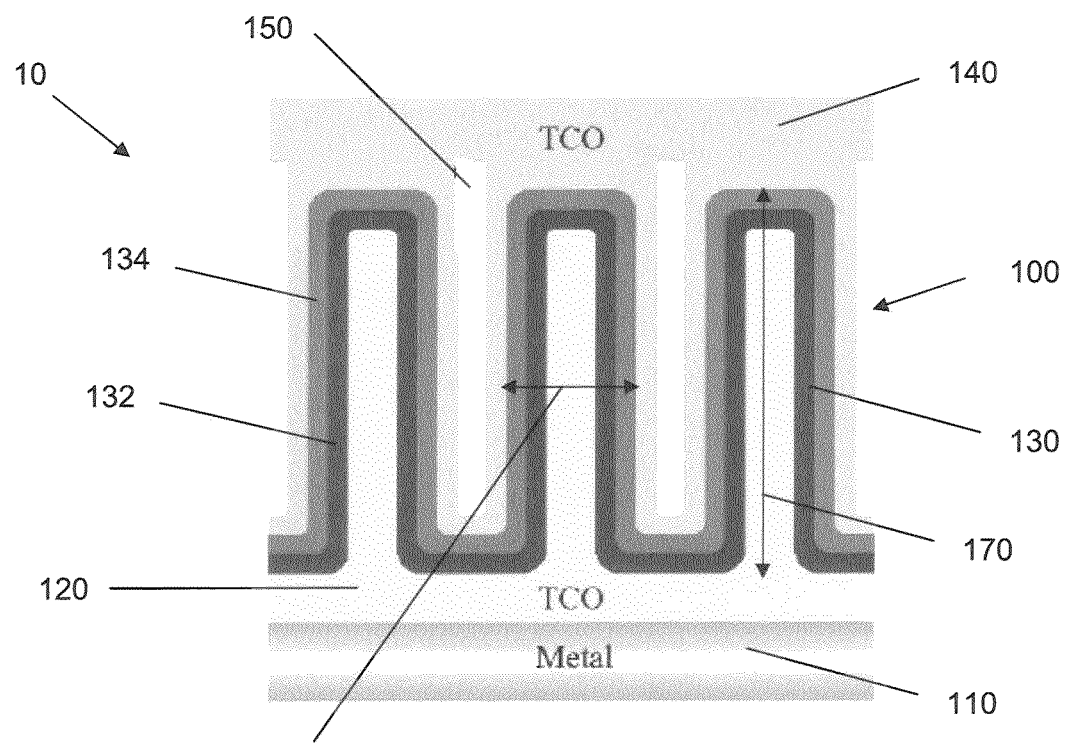
FIG. 1A is a cross-sectional schematic of a portion of the interdigitated photovoltaic device according to an embodiment of the present invention.
Figure 1B:
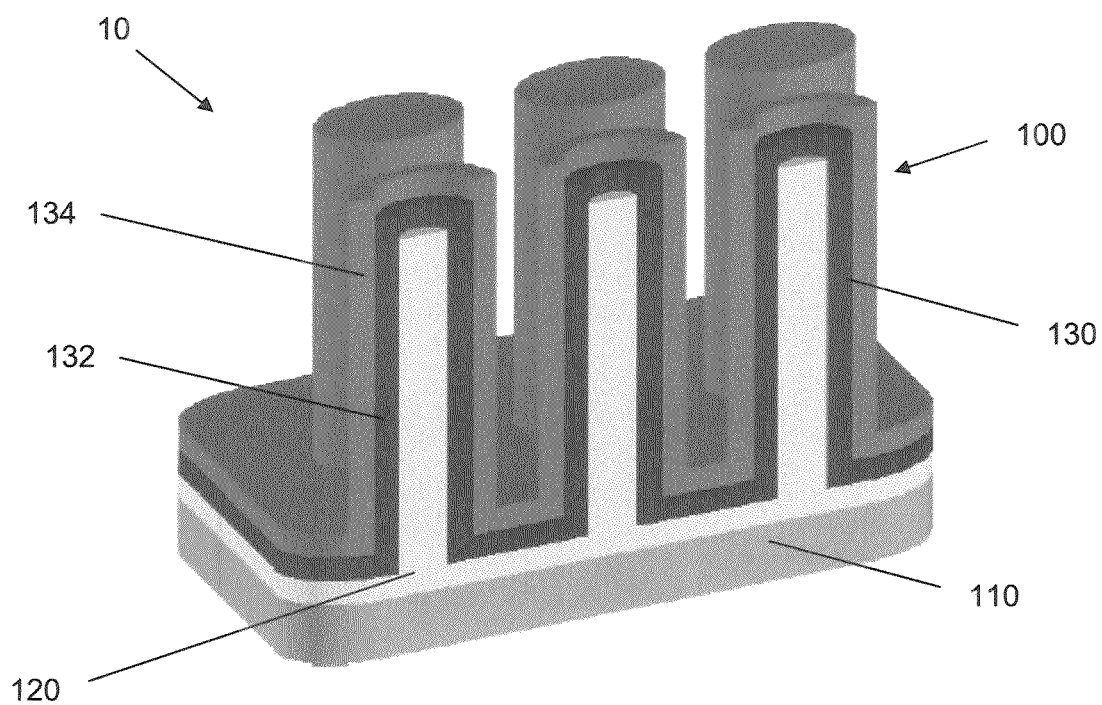
FIG. 1B is a perspective view of a schematic showing a portion of the interdigitated photovoltaic device of FIG. 1A.

FIGS. 1A and 1B, are schematics showing an exemplary configuration of an interdigitated PV device 10. The interdigitated PV device 10 may comprise a device where the planar junction is effectively folded to form a nanorod array 100. The interdigitation may include not only interfacial active layers 130, but also a first and a second transparent conducting oxide (TCO) electrode 120 and 140. The depicted configuration permits radial charge collection in the interdigitated PV device 10. In the depicted embodiment, the interfacial active layers comprise a first active layer 132 and a second active layer 134 coupled to the first active layer 132. As shown in FIG. 1A, the first TCO electrode 120 may be coupled to the first active layer 132. The second TCO electrode 140 (not shown in FIG. 1B for clarity) may be coupled to the second active layer 134. Portions of the first TCO 120, the interfacial active layers 130 and the second TCO 140 form the three dimensional nanorod array 100. The nanorod array 100 may be configured with a predetermined aspect ratio of an array width 160 to an array height 170. The predetermined aspect ratio may be configured to optimize charge collection. In various embodiments, the nanorod array 100 may have a high-aspect ratio, that is an aspect ratio greater than or about 100.

The interdigitated PV device 10 may further include a base substrate 110. In various embodiments the base substrate 100 may comprise metal, glass, fused silica or other appropriate material based on the application of the device. The interdigitated PV device 10 may also include a template 150 coupled to the second TCO electrode 140. In various embodiments, the template 150 may comprise anodic aluminum, a glass capillary membrane or other suitable material to increase light harvesting efficiency without loss of charge extraction efficiency.

Figures 2A, 2B:
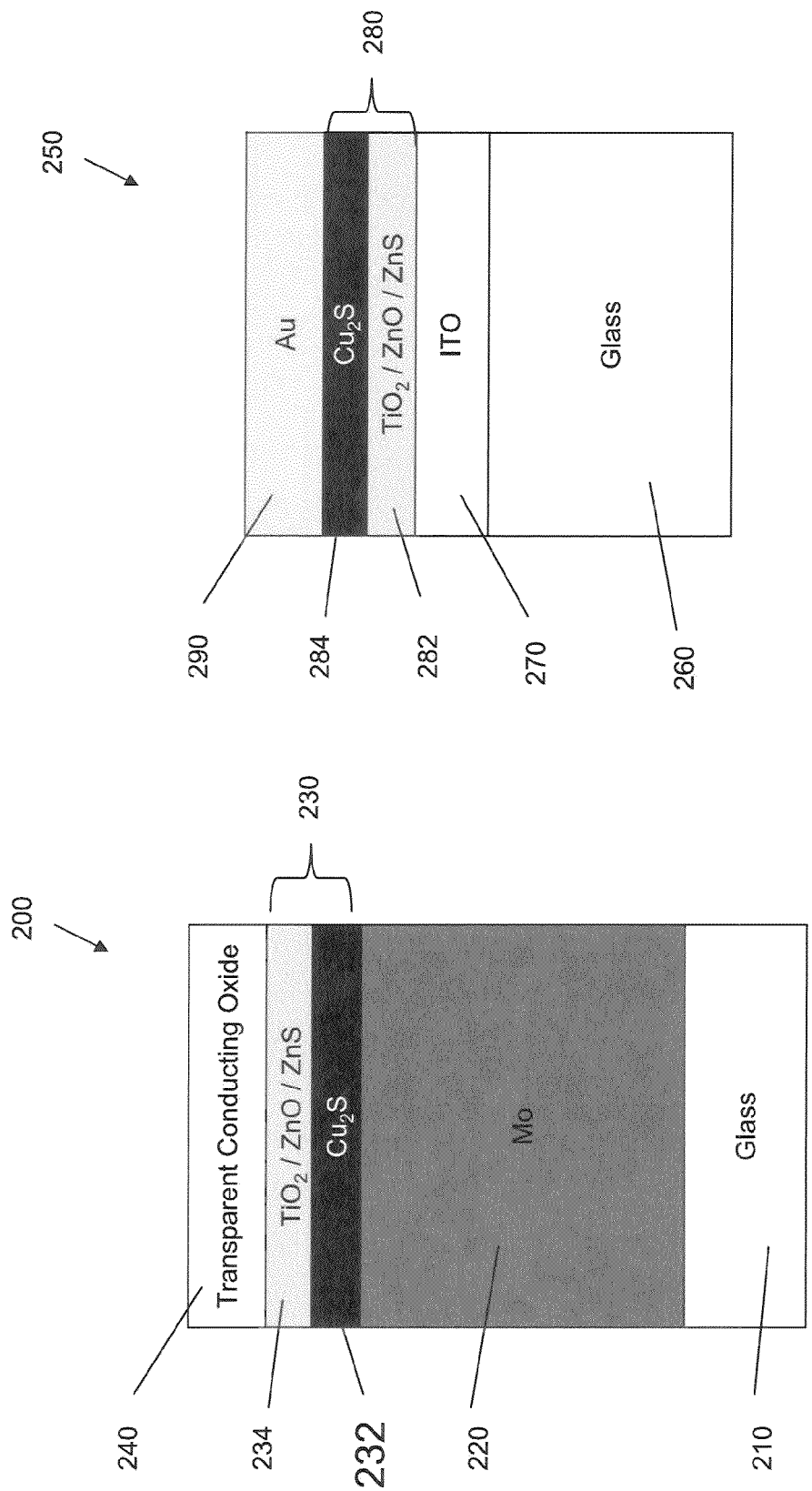
FIG. 2A shows a cross-sectional schematic view of a metal-sulfide film structure applicable to a photovoltaic device according to an embodiment of the present invention.
FIG. 2B shows another cross-sectional schematic of a metal-sulfide film structure applicable to a photovoltaic device.

Additional layers, above or below the metal sulfide film, may further be included. These layers may be prepared using ALD, other deposition techniques, or otherwise incorporated into a multilayer structure comprising the metal sulfide film. Additional metal sulfide films may also be deposited within the multilayer structure. FIGS. 2A and 2B represent exemplary cross-sectional schematics of multilayer PV device structures 200 and 250, respectively, according to further embodiments of the present invention. The multilayer PV device structures 200 and 250 may be prepared using ALD as described herein. Further, the multilayer PV structures 200 and 250 may prepared in a three-dimensional nanorod array similar to the array depicted in FIGS. 1A and 1B. With reference to FIG. 2A, a multilayer PV structure 200 is shown comprising a substrate 210, a metal layer 220, an interfacial active layer 230 and a top TCO electrode 240. In various embodiments, the interfacial active layer 230 may comprise a p-type layer 232 and a n-type layer 234 in contact with the p-type layer 232. In embodiments, the p-type layer 232 comprises a metal sulfide or mixed metal sulfide, for example, $Cu_2S$. The n-type layer 234 may comprise various emitter compositions and/or layers used in PV devices, for example, $TiO_2$/ZnO/ZnS. Each of the active layers may be relative thin films, for example, in a particular embodiment each of the active layers may be about 100 nm. However, other film thickness may be readily prepared. In various embodiments, the substrate 210 may comprise glass or other appropriate substrate material, and the metal layer 220 may comprise molybdenum. In a particular preferred embodiment, the layers of the multilayer PV structure 200 are arranged as shown in FIG. 2A.

FIG. 2B depicts another multilayer PV structure 250 comprising a substrate 260, a TCO electrode 270, an interfacial active layer 280 and a metal layer 290. In various embodiments, the interfacial active layer 280 may comprise a n-type layer 282 and a p-type layer 284 in contact with the n-type layer 282. In various embodiments, the p-type layer 284 comprises a metal sulfide or mixed metal sulfide, for example, $Cu_2S$. The n-type layer 282 may comprise various emitter compositions and/or layers used in PV devices, for example, $TiO_2$/ZnO/ZnS. In various embodiments, the substrate 260 may comprise glass or other appropriate substrate material. In particular embodiments, the metal layer 290 may comprise a noble metal, e.g, gold. The TCO electrode 270 may comprise indium tin oxide (ITO) in various embodiments. In a particular preferred embodiment, the layers of the multilayer PV structure 250 are arranged as shown in FIG. 2B.

The architecture of the interdigitated PV as described above makes feasible the use of relatively inexpensive and abundant materials in the PV device. For example, $CuInS_2$ in a PV device may be replaced with $Cu_2S$, which is effective in view of the relaxed $L_{CE}$ requirements of the architecture. Through ALD, nanoscale fabrication of PV devices using these generally less expensive materials may be accomplished. In the ALD process, alternate exposures to reactive gas precursors may be separated by inert gas purging to deposit films of metal oxides, sulfides, nitrides or pure elements. The self-limiting nature of the layer-by-layer growth technique makes ALD uniquely suited to high-aspect ratio nanofabrication applications. Thus, ALD permits preparation of conformal coatings of substrates with aspect ratios greater than or about 1:100, which may have application as PV devices, components thereof, including transparent conducting oxides (TCOs), and other devices.

These techniques further open the door to the use of additional relatively inexpensive and abundant materials in PV devices. For example, iron oxide ($\alpha$-$Fe_2O_3$, hematite/rust) is also now an attractive material for use in a PV device, given its abundance, stability, and environmental compatibility. Hematite's failure in previous photoelectrochemical systems has been attributed to its ultra-short hole diffusion length (2-4 nm) compared with its $L_{OD}$>100 nm. Additional film materials including, for example, $In_2S_3$, $CuInS_2$ and $Cu_2ZnSnS_4$, are also applicable to PV devices and other devices prepared using the ALD techniques described herein.

Copper compounds in particular are attractive compared to other common elements found in commercial PV devices (i.e. silicon, cadmium, tellurium, gallium, arsenic, indium) owing to its relative abundance, non-toxicity, and ease of purification. Chalcocite ($Cu_2S$) is particularly appealing as an absorber layer, n-type layer, in thin film photovoltaic devices due to its low cost and nearly ideal bandgap (1.2 eV). To exploit these beneficial characteristics, a method of gas phase chemical vapor deposition of phase-pure $Cu_2S$ by ALD has been developed. The self-limiting surface reaction produced by alternating exposure to Bis(N,N'-di-sec-butylacetamidinato)dicopper(I) ($Cu(DSB)_2$) and hydrogen sulfide ($H_2S$) affords conformal deposition of thin films at temperatures as low as 130° C. Characterization of film morphology, crystallinity, and optical properties shows the as-deposited material to be well suited to applications in alternative approaches to PVs, such as the high-aspect ratio architectures described above.

Metal sulfide films were grown in a custom viscous flow ALD reactor similar in design to those that have been described previously in, for example, U.S. Patent Publication 2008/0286448, which contents are expressly incorporated herein. The ALD process comprises exposing a substrate to a sequence of various precursors for a sequence of predetermined periods of time. A cycle of alternating the various precursors, which may optionally be interspersed with a purge gas, is conducted forming a thin conformal film on the substrate. For example, the substrate may be exposed to a first precursor for a predetermined period of time. A purge gas exposure, which may be a substantially non-reactive gas, for example, $N_2$, may follow the exposure of the first precursor. The substrate may then be exposed to a second precursor, and a purge gas sequence may again follow. The process may further include subsequent sequences of additional precursors, if any, optionally followed by a purge gas. The cycle of alternating precursors is repeated for n cycles until a desired film thickness is formed on the substrate.

The first ALD precursor may comprise a metal precursor such as a non-halogenated metal precursor containing, for example, Cu, Fe, In, Sn or Zn, The second ALD precursor may comprise a second metal precursor to form a bi-metallic film, or another precursor such as a sulfur containing compound. Subsequent ALD precursors may comprise additional metal precursors or other precursors. In various embodiments, the first ALD precursor may comprise a non-halogenated metal precursor. In a particular embodiment, the first ALD precursor may comprise a non-halogenated copper precursor. In a preferred embodiment the copper precursor comprises bis(N,N'-di-sec-butylacetamidinato)dicopper(I) (Cu(DSB)$_2$). In various embodiments, the second ALD precursor comprises a sulfur containing compound. In a particular embodiment, the second ALD precursor comprises hydrogen sulfide ($H_2S$). In embodiments where the first ALD precursor comprises Cu(DSB)$_2$ and the second ALD precursor comprises $H_2S$, a Cu$_2$S film is formed on the substrate by repeating an alternating cycle of the first and the second precursors. More generally, the ALD process comprises a cycle of $MP_1$-$P_2$, where $MP_1$ is the first metal precursor and $P_2$ is the second precursor. The cycle may further comprise an interspersed purge gas, which may be designated $MP_1$-purge-$P_2$-purge.

In other embodiments, the second ALD precursor may comprise a second metal precursor. In a particular embodiment, the second metal precursor may comprise an indium metal precursor. In a preferred embodiment, the second metal precursor may comprise cyclopentadienyl indium (InCp) where indium is in the +1 oxidation state. In various embodiments, where the second ALD precursor comprises a metal precursor, the third ALD precursor may comprise a sulfur containing precursor, for example, $H_2S$. In other embodiments, the second metal precursor may be the third ALD precursor and the second and the fourth ALD precursors may comprise $H_2S$. Accordingly, in various embodiments the ALD cycle may comprise $MP_1$-$MP_2$-$P_3$ and in another embodiment the cycle may comprise $MP_1$-$P_2$-$MP_3$-$P_4$. A purge gas may be interspersed in the above defined ALD cycles between any and all of the various precursors. In a particular embodiment, a CuInS$_2$ film may be prepared where $MP_1$ is selected as Cu(DSB)$_2$, $MP_3$ is selected as InCp, and $P_2$ and $P_4$ comprise $H_2S$. It should be noted that the order of $MP_1$ and $MP_3$ in the cycle may be exchanged. In other words, the ALD cycle may alternatively comprise $MP_3$-$P_2$-$MP_1$-$P_4$.

In still further embodiments, the ALD cycle may comprise $MP_1$-$P_2$-$MP_3$-$P_4$-$MP_5$-$P_6$. Again, a purge gas may be interspersed in between any and all of the various precursors of the above cycle. In various embodiments, $MP_1$ may comprise a non-halogenated copper precursor, and in a preferred embodiment the copper precursor comprises Cu(DSB)$_2$. The $MP_3$ precursor may comprise a second metal precursor, and in particular embodiments a Zn compound precursor. The $MP_5$ precursor may comprise a third metal precursor, and in particular embodiments a Sn compound precursor. $P_2$, $P_4$ and $P_6$ may comprise a sulfur compound such as $H_2S$. In a particular embodiment, a Cu$_2$ZnSnS$_4$ film may be prepared where $MP_1$ is selected as Cu(DSB)$_2$, $MP_3$ comprises a Zn compound, $MP_5$ comprises a Sn compound, and $P_2$, $P_4$ and $P_6$ comprise $H_2S$. Again, the cycle order is not limited to $MP_1$, $MP_3$, $MP_5$. One of skill in the art will also appreciate that a cycle may include additional metal precursors, $MP_n$, and additional precursors, $P_n$, to obtain one or more films of desired characteristics.

Exposure of the substrate to the various precursors and the purge gas may be expressed as a timing sequence where each exposure comprises a predetermined exposure time. In the case of a cycle comprising $MP_1$-purge-$P_2$-purge, the ALD timing sequences can be expressed as $t_1$-$t_2$-$t_3$-$t_4$, where $t_1$ is the exposure time for the first metal precursor, $t_2$ is the purge time following the first exposure, $t_3$ is the exposure time for the second precursor, and $t_4$ is the purge time following the exposure to the second precursor, where the units for each exposure is in seconds. The properties of the resulting film may be configured by adjustably establishing the predetermined time for each sequence in the ALD cycle. The properties of the film may further be influenced by selectively adjusting, for example, the number of cycles, the ALD process temperature, and the substrate temperature.

The substrate exposed to the ALD process may comprise any of a number of substrates compatible with ALD and the various precursors used in the process. For example, the substrate may comprise silicon, fused silica, other materials, and combinations thereof. In various embodiments, the substrate may comprise a high-aspect ratio substrate (e.g., an aspect ratio of greater than or about 1:100). The high-aspect ratio substrates have particular application, in among other fields, PV devices. Selection of the precursors and ALD process parameters (as described in detail below) may be selected to produce a conformal thin film on the high-aspect ratio substrate. The resulting coated high-aspect ratio substrate conveniently decouples the active layer thickness and the diffusion length of the charge carrier in a PV device. Accordingly, a number of compositions hereto generally undesirable or less desirable for use in PV devices may now be effectively employed. These compositions may comprise relatively inexpensive and abundant materials and environmentally friendly materials.

The following non-limiting example is illustrative of various aspects of the invention.

EXAMPLE 1

In a particular embodiment, a Cu$_2$S film was formed on a substrate by ALD using alternating exposures of a first precursor of [Cu($^s$Bu-amd)]$_2$ (Strem, 99%) and a second precursor $H_2S$ (Sigma-Alrich, ≥99.5%). The Cu$_2$S films were deposited on 1×2 cm Si(100) and 2×2 cm fused silica substrates. Prior to loading, the substrates were ultrasonically cleaned in acetone and then isopropanol and blown dry using nitrogen. Prior to the Cu$_2$S ALD, the substrates were first coated with 2 nm ALD Al$_2$O$_3$. The [Cu($^s$Bu-amd)]$_2$ first precursor vapor was delivered by 200 sccm nitrogen flow through a bubbler held at 110° C. while the $H_2S$ second precursor was stepped down to ~10 Torr through a regulator. [Caution: $H_2S$ is a highly explosive and toxic gas.] A nitrogen purge gas was used after the first and the second precursor exposures. Ultrahigh purity nitrogen carrier gas continuously passes through the flow tube at a mass flow rate of 300 sccm and a pressure of 1 Torr. The process may be carried out a relative low temperature, for example, about 130° C. in a particular embodiment. The timing sequence was 15-15-1-10.

Figure 3:
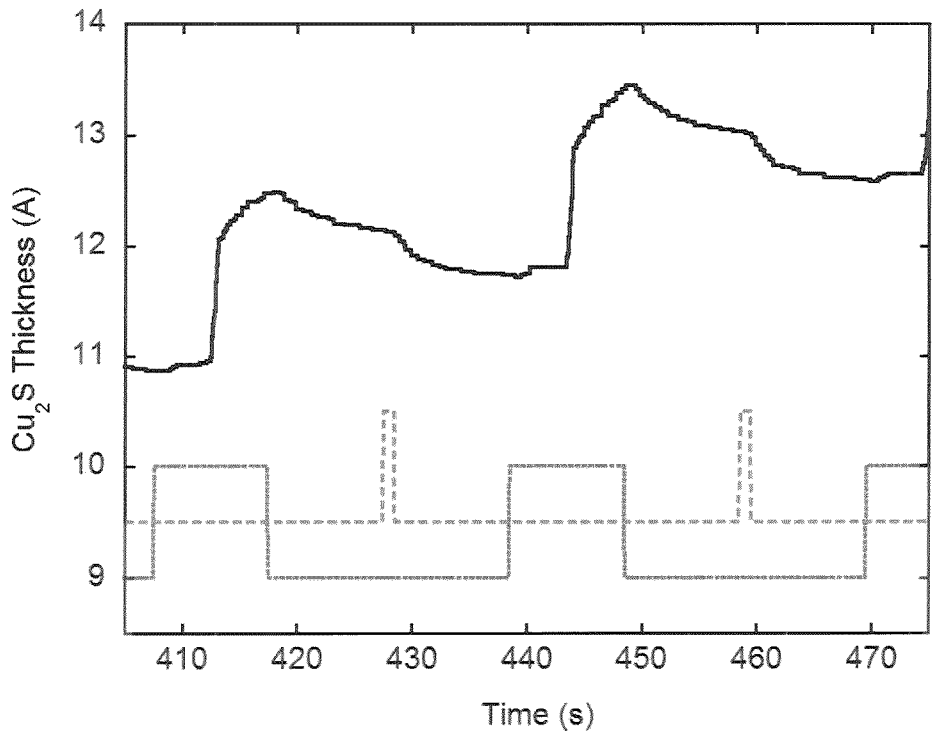
FIG. 3 shows the growth in the thickness of the metal sulfide film with respect to time and in relation to the exposure of the $[Cu(^sBu\text{-amd})]_2$ (solid line) and $H_2S$ (dotted line) precursors.
Figure 4:
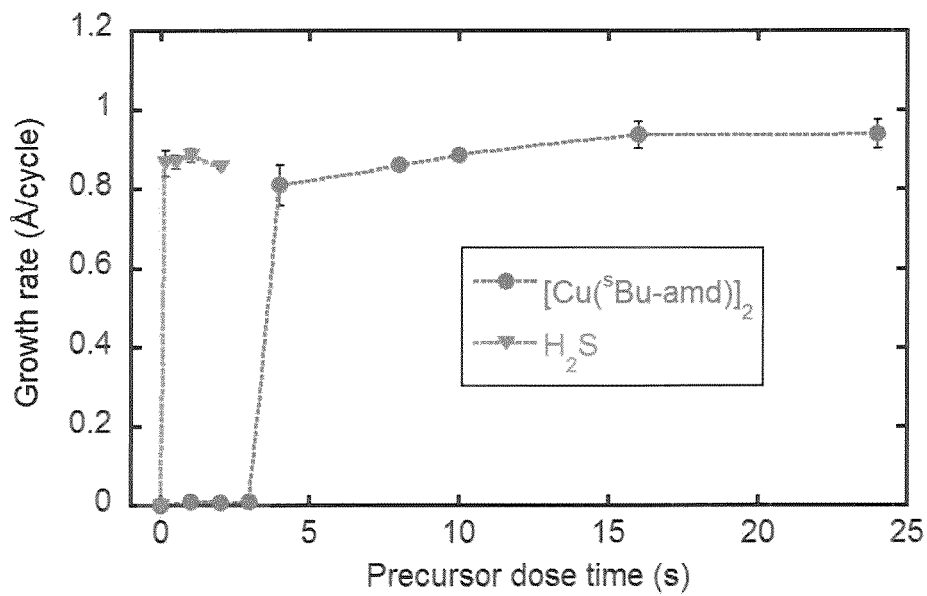
FIG. 4 shows the growth rate per cycle as a function of exposure time to each molecular precursor. While varying the exposure time of the alternate precursor, 10 s and 1 s exposures to $[Cu(^sBu\text{-amd})]_2$ and $H_2S$ were used, respectively.

To enable in situ measurements, a QCM was installed in the ALD reactor in place of the substrates. The self-limiting growth of $Cu_2S$ employing $[Cu(^sBu\text{-amd})]_2$ is demonstrated by in situ QCM at 130° C. With reference to FIGS. 3 and 4, the saturation kinetics of each half-reaction show the hallmark of authentic ALD growth. A maximum growth rate of 0.94 Å/cycle was measured assuming a density of 5.8 g/cm³, corresponding to hexagonal chalcocite (high-chalcocite, $\beta$-$Cu_2S$). The $\beta$-$Cu_2S$ is the thermodynamically stable phase of chalcocite above 104° C. The absence of decomposition (which leads to non-self-limiting, CVD-like growth) at this temperature is not surprising given previous reports of copper (I) nitride ALD using the same precursor at this temperature in addition to extensive characterization of the precursor family.

Film morphology was assessed with a Hitachi S4700 scanning electron microscope (SEM). X-ray diffraction (XRD) measurements were acquired on a Rigaku Miniflex Plus diffractometer using Cu Kα radiation. UV-vis-IR reflection-corrected absorption spectra were derived from measurements employing a Varian Cary 5000 with integrating sphere accessory (DRA-2500). The morphology of $Cu_2S$ via the ALD process was revealed by SEM analysis. Not to be limited by theory, the images of films prepared on silicon illustrated in FIGS. 5A-5D suggest that growth occurs via island coalescence with film closure occurring between 162 and 500 ALD cycles. The amount of material deposited during each cycle evolves over the first ~300 cycles with the change in surface area (a result further borne out qualitatively in QCM studies), an average growth rate of ~0.9 Å/cycle may be estimated from cross-sectional SEM analysis of a 500 cycle film, which matches well the growth rate via QCM.

The phase purity and crystallographic orientation of the thin films were deduced from XRD. FIG. 6 shows the pattern of the thickest (500 cycle) film may be indexed to $\beta$-$Cu_2S$ (JCPDS 26-1116). Identical but lower intensity, peaks or an absence of diffraction was observed for samples with fewer ALD cycles (not shown) suggesting instrument sensitivity limitations and/or a mostly amorphous material. Reflection indexing of $Cu_2S$ grown under the ALD conditions described above reveals a high preferential <001> orientation of the films. This preferential orientation of $\beta$-$Cu_2S$ was also reported for films grown by AACVD. However, $\beta$-$Cu_2S$ is known to undergo a phase change to $\alpha$-$Cu_2S$ (monoclinic, low-chalcocite) at temperatures below 104° C. in which the (002) $\beta$-$Cu_2S$ crystal plane transforms to the (204) plane of the $\alpha$-$Cu_2S$ lattice. While the majority of expected $\alpha$-$Cu_2S$ reflections are absent in the oriented thin films, previous studies have demonstrated reflections consistent with $\alpha$-$Cu_2S$ upon film detachment by sonication. However, the highly adherent films produced by ALD using the present process prevented this verification.

Figure 7:
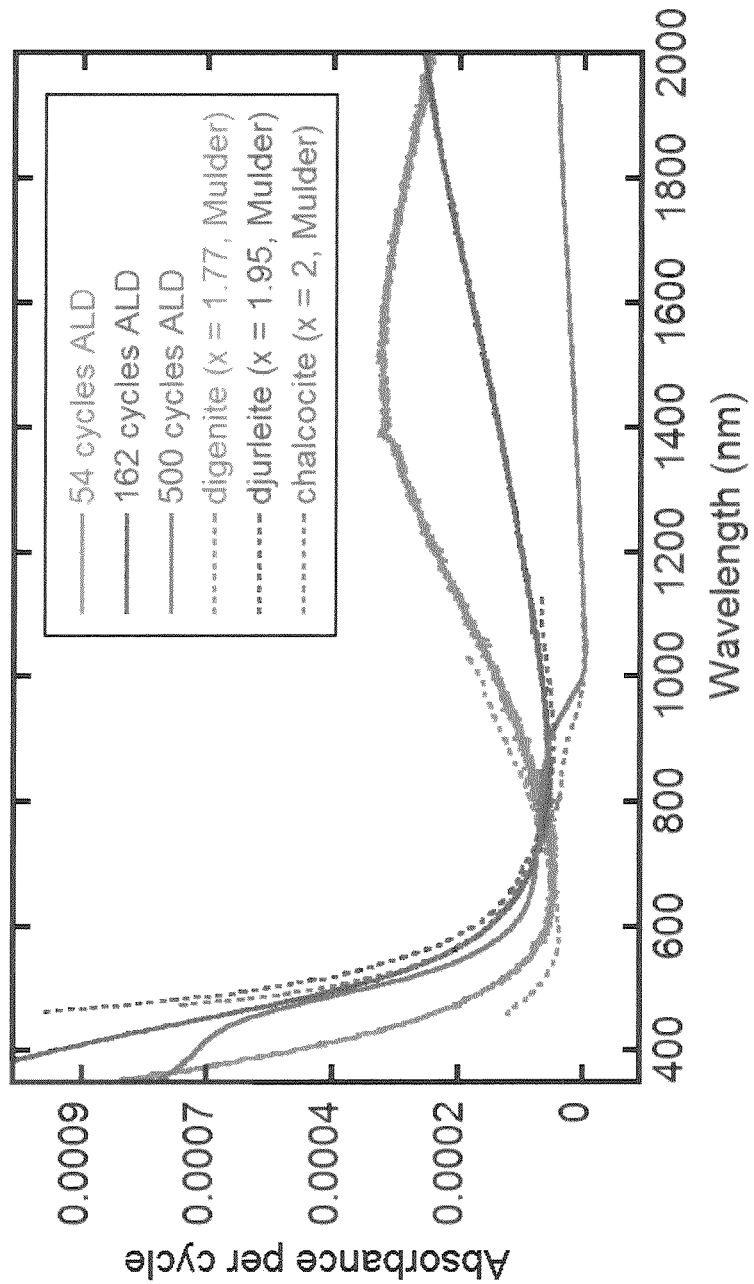
FIG. 7 shows Absorbance per cycle of $Cu_xS$ grown by 52, 162 (measured after aging in ambient overnight) and 500 ALD cycles (measured within 1 hour), solid lines, reproduction of polarization-averaged absorption coefficients (dotted lines) are shown scaled for comparison to the corresponding ALD sample.

The suitability of ALD formed $\alpha$-$Cu_2S$ thin films for application in PV is further established by UV-vis-NIR spectroscopy. In contrast to XRD and electrical characterization, the extent of copper deficiency in $Cu_xS$ may be probed for very thin films, even prior to crystallite formation or island coalescence. The optical assignment of $Cu_xS$ single crystal polymorphs ($2 \geq x \geq 1.75$) is enabled by previous detailed spectroscopic studies. As depicted in FIG. 7, the absorbance spectra of samples using the present process were found to correlate with the absorbance of these previously reported single crystal polymorphs. The similarities suggest that, like single crystals, $Cu_2S$ gown by ALD is prone to copper depletion under ambient conditions, apparently in proportion to its surface area to volume ratio. Indirect (1.2 eV) and direct (1.3 and 1.8 eV) bandgaps for the 500 cycle sample were estimated from plots of $(\alpha h\nu)^{1/2}$ and $(\alpha h\nu)^2$ vs hν plots, respectively (not shown), in agreement with literature values.

The chemical vapor deposition of chalcocite was realized by ALD. A maximum growth rate of ~0.9 Å/cycle at 130° C. was measured from both in situ QCM and cross-sectional SEM analysis. XRD and optical spectroscopy confirm the phase purity of the preferentially orientation thin films. The growth of high quality and conformal $Cu_2S$ films make this process a promising route to nanostructured photovoltaics.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described to explain the principles of the present invention and its practical application to enable one skilled in the art to utilize the present invention in various embodiments and with various modifications as are suited to the particular use contemplated. The features of the embodiments described herein may be combined in all possible combinations of methods, apparatus, modules and systems.

What is claimed is:

1. A method for preparing a portion of an interdigitated photovoltaic device, comprising:
   providing an atomic layer deposition (ALD) reactor;
   providing a high-aspect ratio substrate;
   providing a first non-halogenated precursor comprising Bis(N,N'-di-sec-butylacetamidinato)dicopper(I);
   providing a second non-halogenated precursor comprising a sulfur compound;
   reacting the first non-halogenated precursor in the ALD reactor for a first period;
   reacting the second non-halogenated precursor in the ALD reactor for a second period;
   repeating the reactions of the first non-halogenated precursor and the second non-halogenated precursor for a number of cycles until a chalcocite film of a desired thickness is formed on the high-aspect ratio substrate.

2. The method of claim 1, wherein the second non-halogenated precursor comprises $H_2S$.

3. The method of claim 2, wherein the chalcocite film consists essentially of $Cu_2S$.

4. The method of claim 1, wherein the chalcocite film consists essentially of a copper sulfide.

5. The method of claim 4, wherein the copper sulfide is selected from the group of $Cu_xS$, where x is about 1.8-2.2.

6. The method of claim 1, wherein the chalcocite film is deposited on a transparent oxide conductor (TCO) electrode coupled to the high-aspect ratio substrate, and wherein the chalcocite film is further coupled to a n-type semiconductor.

7. The method of claim 6, further comprising preparing an interdigitated photovoltaic device using the high-aspect ratio substrate.

8. The method of claim 1, further comprising:
   providing a purge gas; and
   substantially purging the ALD reactor with the purge gas after at least one of the first period and the second period.

9. A method for preparing a $Cu_2S$ film on a substrate, comprising:
   providing an atomic layer deposition (ALD) reactor;
   providing a substrate;
   providing a first non-halogenated precursor, the first precursor comprising Bis(N,N'-di-sec-butylacetamidinato) dicopper(I);

providing a second non-halogenated precursor, the second precursor comprising $H_2S$;

heating the substrate to a reaction temperature;

exposing the substrate in the ALD reactor to the first non-halogenated precursor for a first predetermined duration;

exposing the substrate in the ALD reactor to the second non-halogenated precursor for a second predetermined duration;

repeating for a predetermined number of cycles exposure of the substrate in the ALD reactor to the first non-halogenated precursor and the second non-halogenated precursor to form a $Cu_2S$ film on the substrate.

10. The method of claim 9, further comprising:

providing a purge gas; and substantially purging the ALD reactor with the purge gas after at least one of the first predetermined duration and the second predetermined duration.

11. The method of claim 9, wherein the substrate comprises a high-aspect ratio substrate.

12. A method for preparing a portion of an interdigitated photovoltaic device, comprising:

providing an atomic layer deposition (ALD) reactor;

providing a high-aspect ratio substrate;

providing a first non-halogenated precursor comprising Bis(N,N'-di-sec-butylacetamidinato)dicopper(I);

providing a second non-halogenated precursor comprising a sulfur compound;

reacting the first non-halogenated precursor in the ALD reactor for a first period;

reacting the second non-halogenated precursor in the ALD reactor for a second period; and repeating the reactions of the first non-halogenated precursor and the second non-halogenated precursor for a number of cycles until a chalcocite film of a desired thickness is formed on the high-aspect ratio substrate;

wherein an average growth rate of the chalcocite film of at least about 0.9 Å per cycle is achieved.

13. The method of claim 12, wherein the second non-halogenated precursor comprises $H_2S$.

14. The method of claim 12, wherein the chalcocite film consists essentially of a copper sulfide.

15. The method of claim 14, wherein the copper sulfide is selected from the group of $Cu_xS$, where x is about 1.8-2.2.

16. The method of claim 12, wherein the chalcocite film is deposited on a transparent oxide conductor (TCO) electrode coupled to the high-aspect ratio substrate, and wherein the chalcocite film is further coupled to a n-type semiconductor.

17. The method of claim 16, further comprising preparing an interdigitated photovoltaic device using the high-aspect ratio substrate.

\* \* \* \* \*